US009509323B2

(12) United States Patent
Thiagarajan et al.

(10) Patent No.: US 9,509,323 B2
(45) Date of Patent: Nov. 29, 2016

(54) FRACTIONAL-N SYNTHESIZER WITH PRE-MULTIPLICATION

(71) Applicant: TEXAS INSTRUMENTS INCORPORATED, Dallas, TX (US)

(72) Inventors: Krishnaswamy Thiagarajan, Bangalore (IN); Jagdish Chand Goyal, Bangalore (IN); Srikanth Manian, Bangalore (IN); Debapriya Sahu, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/709,759

(22) Filed: May 12, 2015

(65) Prior Publication Data
US 2015/0326236 A1 Nov. 12, 2015

Related U.S. Application Data

(60) Provisional application No. 61/992,134, filed on May 12, 2014.

(51) Int. Cl.
*H03D 3/24* (2006.01)
*H03L 7/197* (2006.01)
*H04B 1/40* (2015.01)
*H04L 7/033* (2006.01)
*H03L 7/081* (2006.01)

(52) U.S. Cl.
CPC ........... *H03L 7/1976* (2013.01); *H03L 7/0814* (2013.01); *H03L 7/1974* (2013.01); *H04B 1/40* (2013.01); *H04L 7/033* (2013.01); *H04L 7/0331* (2013.01); *H03L 2207/10* (2013.01)

(58) Field of Classification Search
CPC ....... H03L 7/1974; H03L 7/23; H03L 7/097; H03L 7/099; H03L 7/18
USPC .......................... 375/221, 373, 376; 327/105
See application file for complete search history.

(56) References Cited

U.S. PATENT DOCUMENTS

| 8,502,575 B2* | 8/2013 | Zhang | H03L 7/0898 327/147 |
| 2006/0132202 A1* | 6/2006 | Meltzer | H03L 7/23 327/156 |
| 2012/0074995 A1* | 3/2012 | Zhang | H03L 7/1976 327/156 |

OTHER PUBLICATIONS

Hedayati, Hiva, et al., "Closed-Loop Nonlinear Modeling of Wideband ΣΔ Fractional-N Frequency Synthesizers", IEEE Transactions on Microwave Theory and Techniques, vol. 54, No. 10, pp. 3654-3663, Oct. 2006.

(Continued)

*Primary Examiner* — David S Huang
(74) *Attorney, Agent, or Firm* — Michael A. Davis, Jr.; Frank D. Cimino

(57) ABSTRACT

A fractional-N frequency synthesizer that suppresses integer boundary spurs. A frequency synthesizer includes a fractional-N phase locked loop (PLL) and a reference frequency scaler. The reference frequency scaler is coupled to a reference clock input of the PLL, the reference frequency scaler includes a programmable frequency divider, and a programmable frequency multiplier connected in series with the programmable frequency divider. Each of the divider and multiplier is configured to scale a reference frequency provided to the PLL by a programmable integer value.

26 Claims, 4 Drawing Sheets

(56) References Cited

OTHER PUBLICATIONS

ETSI TS 102 361-1 V2.3.1; Technical Specification; Electromagnetic compatibility and Radio spectrum Matters (ERM); Digital Mobile Radio (DMR) Systems; Part 1: DMR Air Interface (AI) protocol; Jul. 2013; 174 pages.

ETSI TS 102 361-2 V2.2.1; Technical Specification; Electromagnetic compatibility and Radio spectrum Matters (ERM); Digital Mobile Radio (DMR) Systems; Part 2: DMR voice and generic services and facilities; Jul. 2013; 103 pages.

ETSI TS 102 361-3 V1.2.1; Technical Specification; Electromagnetic compatibility and Radio spectrum Matters (ERM); Digital Mobile Radio (DMR) Systems; Part 3: DMR data protocol; Jul. 2013; 53 pages.

ETSI TR 102 398 V1.3.1; Technical Report; Electromagnetic compatibility and Radio spectrum Matters (ERM); Digital Mobile Radio (DMR) General System Design; Jan. 2013; 70 pages.

* cited by examiner

FRACTIONAL-N SYNTHESIZER WITH PRE-MULTIPLICATION

CROSS-REFERENCE TO RELATED APPLICATIONS

The present application claims priority to U.S. Provisional Patent Application No. 61/992,134, filed May 12, 2014, entitled "Fractional-N Synthesizer with Pre-Multiplication," which is hereby incorporated herein by reference in its entirety.

BACKGROUND

Professional Mobile Radio (PMR), also known as land mobile radio (LMR) in North America and private mobile radio (PMR) in the UK, was developed for business users who need to communicate over relatively short distances with a central base station/dispatcher. PMR systems may be used in military, oil and gas, public security, rail transport, emergency, and various other applications.

PMR systems have generally been based on analog technology. To increase spectrum efficiency as well as improve communication quality, various jurisdictions plan to migrate from analog to digital PMR/LMR.

DMR (Digital Mobile Radio) is a digital radio standard for Professional Mobile Radio (PMR) systems. Requirements of the DMR standard include a channel spacing of 6.25 kHz, and a spurious emission specification of −83dBc (dB relative to the carrier).

The frequency synthesizers employed in digital radio systems often employ a phase locked loop to generate radio frequency signals.

SUMMARY

A fractional-N frequency synthesizer that suppresses integer boundary spurs is disclosed herein. In one embodiment, a frequency synthesizer includes a fractional-N phase locked loop (PLL) and a reference frequency scaler. The reference frequency scaler is coupled to a reference clock input of the PLL, the reference frequency scaler includes a programmable frequency divider, and a programmable frequency multiplier connected in series with the programmable frequency divider. Each of the divider and multiplier is configured to scale, by a programmable integer value, a reference frequency provided to the PLL.

In another embodiment, a method for fractional-N frequency synthesis includes selecting an output frequency to be generated. A frequency of a reference clock provided to a fractional-N PLL is scaled by dividing by a programmable integer divisor and multiplying by a programmable integer multiplier. The multiplier and divisor for every output frequency of the PLL are selected to suppress integer boundary spurs in the signal output of the PLL. The output frequency is generated in the PLL.

In a further embodiment, a digital radio includes radio frequency front end circuitry and a fractional-N frequency synthesizer coupled to the radio frequency front end circuitry. The frequency synthesizer is configured to generate carrier frequencies for the radio frequency front end circuitry. The frequency synthesizer includes a fractional-N PLL, and a reference frequency scaler coupled to a reference clock input of the PLL. The reference frequency scaler includes a programmable frequency divider, and a programmable frequency multiplier connected in series with the programmable frequency divider. Each of the divider and multiplier is configured to scale a reference frequency provided to the PLL by a programmable integer value.

BRIEF DESCRIPTION OF THE DRAWINGS

For a detailed description of various examples, reference will now be made to the accompanying drawings in which.

NOTATION AND NOMENCLATURE

Figure 1:
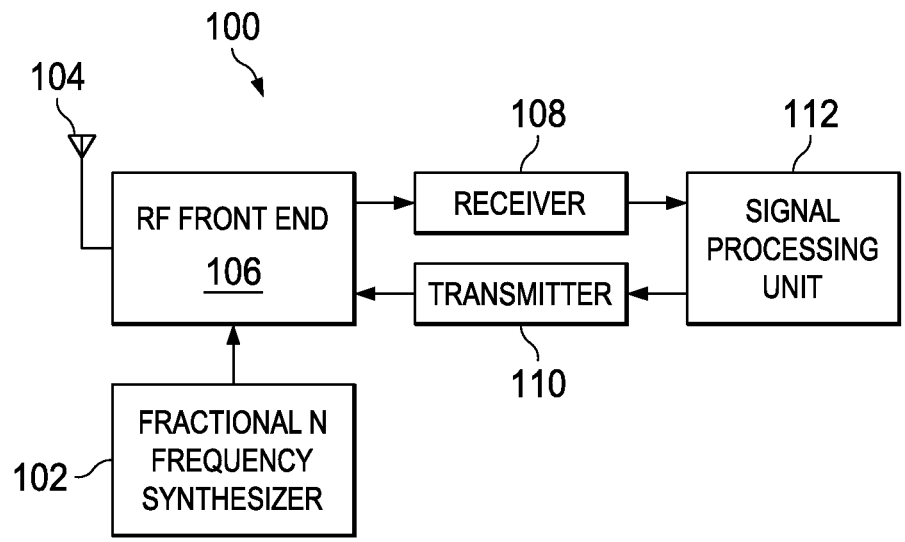
FIG. 1 shows a block diagram of a digital radio in accordance with various embodiments.

Certain terms are used throughout the following description and claims to refer to particular system components. As one skilled in the art will appreciate a component may be referred to by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect, direct, optical or wireless electrical connection. Thus, if a first device couples to a second device, that connection may be through a direct connection or an indirect connection via other devices and connections. The recitation "based on" is intended to mean "based at least in part on." Therefore, if X is based on Y, X may be based on Y and any number of other factors.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

For a digital radio having a channel spacing of 6.25 kHz and a spurious emission specification of −83 dBc (dB relative to the carrier) the performance requirements for phase locked loop (PLL) frequency synthesis are relatively high. For example, if an integer-N PLL is used to implement a frequency synthesizer for such a radio, then the PLL reference frequency must be as low as 6.25 kHz, and loop bandwidth must be on the order of 600 Hz or less. Such a PLL may provide insufficient filtering of voltage controlled oscillator (VCO) noise, and phase noise will be unacceptably high for most practical implementations.

On the other hand, use of a fractional-N PLL has the attendant problem of integer boundary spurs that occur whenever the output to input frequency ratio is very close to an integer. Some conventional implementations of fractional-N synthesizers include a frequency doubler followed by a divider in the reference frequency input path. Such a PLL architecture can suppress integer boundary spurs in odd channels, but undesirable integer boundary spurs remain for even channels. For example, in such a PLL, if:

$$N.F = \frac{F_{out}}{\left(\frac{2F_{in}}{R}\right)},$$

and
where:
N.F is the PLL loop frequency divisor coefficient, N is the integer portion of the coefficient and F is the fraction portion of the coefficient;
$F_{out}$ is the PLL output signal frequency;
$F_{in}$ is the input signal frequency; and
R is the divisor coefficient applied to $F_{in}$.

$$\text{Spur} = \frac{2F_{in}}{R} * 0.F \text{ or } \frac{2F_{in}}{R} * (1 - 0.F)$$

where:
Spur is the frequency of integer boundary spurious signal generated in the PLL.
If:
    $F_{out}$=499.2063 MHz,
    $F_{in}$=38.4 MHz,
    R=3,
    N.F=19.50024609, and
    Spur=12.8063 MHz.
The spurious signal frequency, 12.8063 MHz, is substantially higher than the bandwidth of the PLL, so the spurs are rejected.
However, if:
    $F_{out}$=460.80625 MHz,
then
    N.F=18.000244, and
    Spur=0.00625 MHz.
The spurious signal frequency, 0.00625 MHz, is substantially lower than the bandwidth of the PLL, so the spurs are not rejected.

Embodiments of the fractional-N frequency synthesizer disclosed herein include PLL reference frequency generation that can vary the reference frequency provided to the PLL to prevent spurs in the PLL output. The fractional-N frequency synthesizer includes a variable frequency multiplier and a variable frequency divider at the reference input of the PLL. Control logic sets the frequency multiplier and divider to produce a PLL reference frequency, that when applied to the PLL, produces integer boundary spurs at frequencies that are substantially higher than the loop bandwidth of the PLL, and are therefore rejected by the PLL. The control logic may set the frequency multiplier and divider differently for each PLL output frequency as needed to ensure that the spur frequencies are suppressed by the PLL.

FIG. 1 shows a block diagram of a digital radio in accordance with various embodiments. The digital radio 100 may conform to radio communication standards promulgated by the European Telecommunications Standards Institute (ETSI), such as the digital mobile radio standard, or to any of various other standards. The digital radio 100 includes an antenna 104, a radio frequency (RF) front end 106, a receiver 108, a fractional-n frequency synthesizer 102, a transmitter 110, and a signal processing unit 112. While, in the interest of clarity, the digital radio 100 is presented in FIG. 1 as having a particular architecture, other embodiments of the digital radio 100 may be arranged differently and/or include different/additional components or functional subsystems.

In some embodiments, the radio 100 operates as a half-duplex transceiver, which means that the radio 100 is configured to provide a non-simultaneously bi-directional communication. At any given time, either a receive (RX) path or a transmit (TX) path is provided. While the RX path is in use, the TX path may be deactivated and vice versa. The RX path and the TX path may use the same RF front end 106 and the antenna 104. As such, the RF front end 106 may include a duplexer configured to switch between the RX path and the TX path. A signal in the RX path starts at the antenna 104, and passes through the RF front end 106 and the receiver 108 to the signal processing unit 112. A signal in the TX path may travel through the signal processing unit 112, the transmitter 110, and the RF front end 106, and be transmitted via the antenna 104. More particularly, in the TX path, the transmitter 110 may encode digital data, provided by the signal processing unit 112, to a baseband signal. The RF front end 104 may include a modulator that modulates the baseband signal with an RF carrier signal provided by the synthesizer 102. The RF front end may also include a transmission power amplifier for amplifying the modulated signal for transmission via the antenna 104, and various other transmit path components.

The antenna 104 converts RF signals between conducted and airwave form. Upon receipt of an RF signal over the antenna 104, the RF front end 104 may apply a local oscillation frequency generated by the synthesizer 102 to downconvert the RF signal to an intermediate frequency signal. The receiver 108 coupled to the RF front end 106 is configured to extract information from signals provided by the RF front end 106 and to generate signals to be further processed by the signal processing unit 112.

The fractional-N synthesizer 102 generates signals at frequencies needed for operation of the radio 100. For example, the synthesizer 102 may generate carrier frequencies to be used by the radio 100. The fractional-N synthesizer 102 provides frequency resolution that is a fractional portion of a reference frequency employed in the synthesizer 102. As a result, frequencies generated by the synthesizer 102 can be a non-integer multiple of the reference frequency. However, as explained above, conventional fractional-N synthesizers generate spurious frequencies due to variation in integer division values used to generate the fractional divisor.

The fractional-N synthesizer 102 avoids the generation of integer boundary spurious frequencies that are produced by conventional fractional-N synthesizers. In the fractional-N synthesizer 102, the reference frequency can be adjusted to allow division of the synthesizer output frequency by a fractional value that allows for suppression of spurious signals by the synthesizer 102.

Figure 2:
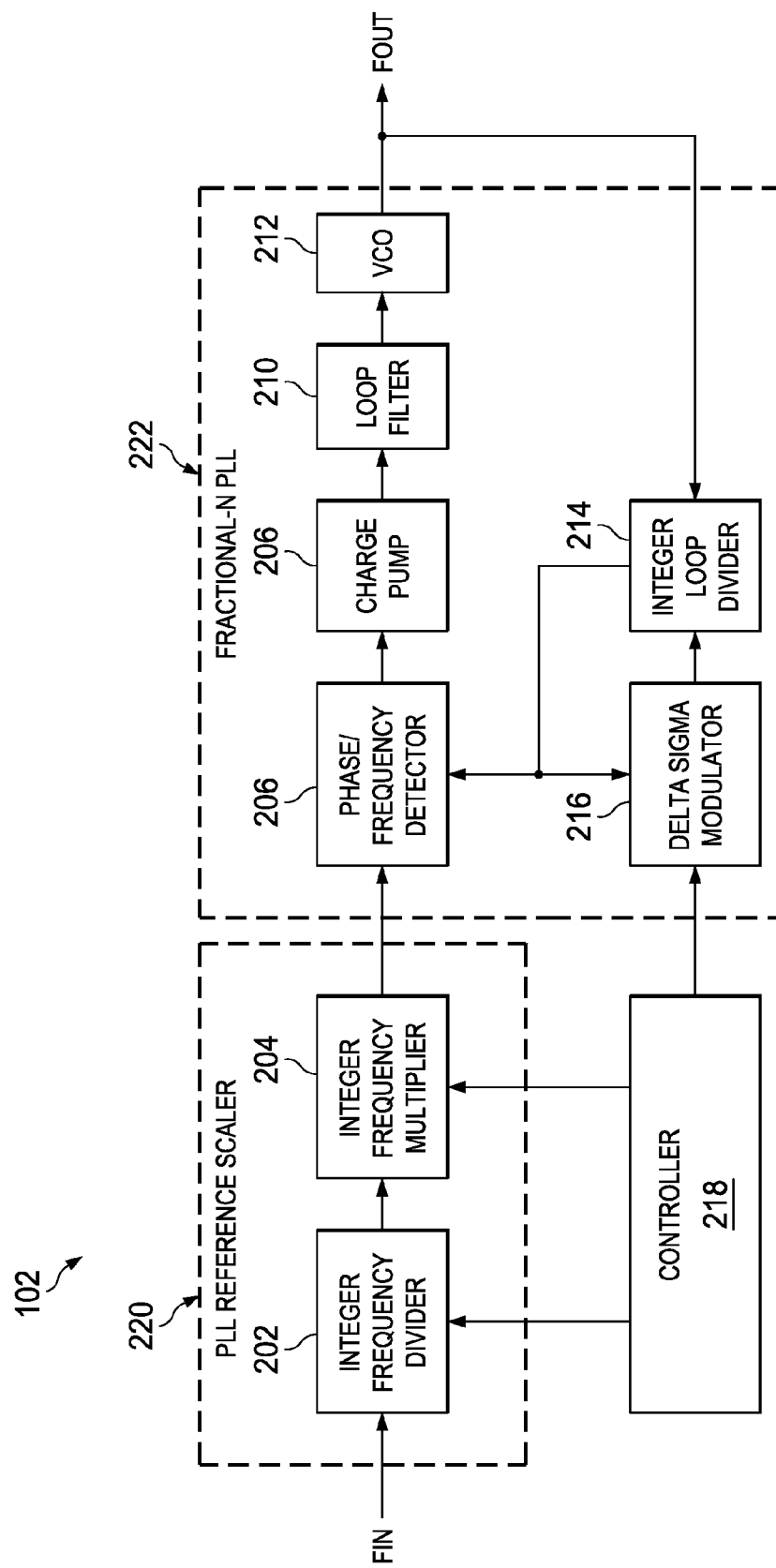
FIG. 2 shows a block diagram of a fractional-N frequency synthesizer in accordance with various embodiments.

FIG. 2 shows a block diagram of an embodiment of the fractional-N frequency synthesizer 102. The fractional-N synthesizer 102 includes a fractional-N PLL 222 and a PLL reference frequency scaler 220. The fractional-N PLL 222 generates an output signal FOUT having a frequency that is a programmable multiple of a reference frequency provided by the PLL reference frequency scaler 220. The fractional-N PLL 222 includes a VCO 212, an integer loop divider 214, a delta-sigma modulator 216, a phase/frequency detector (PFD) 206, a charge pump 208, and a loop filter 210. The VCO 212 generates the PLL output signal FOUT based on a control voltage provided by the loop filter 210. The output frequency of the VCO 212 is reduced by the integer divider 214 and compared, by the PFD 206, to the reference frequency provided by the PLL reference frequency scaler 220. The integer divider 214 may include a dual-modulus divider, binary counters, or other circuitry that allows division of the output frequency of the VCO by a programmable divisor coefficient. The delta-sigma modulator 216 controls variation in the integer values applied by the integer divider 214 to produce the fractional divisor applied to the VCO output frequency. For example, if the fractional divisor to be applied to the VCO output frequency is 10.5, then the delta-sigma modulator 216 may cause the integer loop divider 214 to divide the VCO output frequency by 10 half the time and by 11 half the time to produce an average division of 10.5. The delta-sigma modulator 216 randomizes the application timing of the different integer divisor coefficients while maintaining the desired average divisor coefficient. The delta-sigma modulator 216 may be a multi-stage noise shaping (MASH) delta sigma modulator.

The PFD 206 identifies differences in the phase and/or frequency of the output of the integer divider 214 and the reference frequency provided by the PLL reference frequency scaler 220, and generates signals that control the charge pump 208 responsive to the identified differences in phase and/or frequency. The charge pump 208 generates currents to charge and discharge a capacitor in the loop filter 210. The voltage across the capacitor may form the control voltage applied to the VCO 212. For example, if the PFD 206 determines that the reference frequency provided by the PLL reference frequency scaler 220 is higher than the frequency output by the integer loop divider 214, then the PFD 206 may output signals that cause the charge pump 208 to drive a current into the loop filter 210, thereby increasing the voltage across the capacitor and increasing the output frequency of the VCO 212.

The PLL reference frequency scaler 220 includes an integer frequency divider 202 and an integer frequency multiplier 204. The integer frequency divider 202 and integer frequency multiplier 204 are coupled in series. The integer frequency divider 202 divides an input frequency, e.g., a crystal oscillator generated frequency FIN, by a programmable integer value (i.e., a programmable divisor coefficient). The integer frequency multiplier 204 multiplies the frequency produced by the integer frequency divider 202 by a programmable integer value (i.e., a programmable multiplier coefficient). The integer frequency multiplier 204 may precede the integer frequency divider 202 in some embodiments.

The PLL 222 generally behaves as a low-pass filter, and rejects spurious frequencies that are greater than the loop bandwidth. The programmable integer divisor and multiplier coefficients may be selected for each different frequency output by the synthesizer 102 to allow the fractional portion of the divisor applied in the fractional-N PLL 222 to be set to a value that generates integer boundary spurious signals in the PLL 222 at a frequency that is higher than the bandwidth of the fractional-N PLL 222. Accordingly, the fractional-N PLL 222 suppresses the spurious frequencies and prevents the spurious frequencies from appearing the output signal generated by the fractional-N PLL 222.

The fractional-N frequency synthesizer 102 may also include a controller 218 that determines and sets the frequency scaling coefficients applied by the PLL reference frequency scaler 220 and the fractional-N PLL 222. The controller 218 may be implemented as a processor (e.g., a microcontroller, a general-purpose processor, etc.) that executes instructions retrieved from a storage device, or as dedicated hardware circuitry. The controller 218 may compute the coefficients for fractional-N frequency synthesis based on each selected output frequency, may retrieve pre-computed coefficients from a table, etc.

For each output frequency to be generated by the fractional-N frequency synthesizer 102 the controller 218 generates and provides a fractional divisor coefficient to the delta sigma modulator 216, an integer divisor coefficient to the integer frequency divider 202, and an integer multiplier coefficient to the integer frequency multiplier 204. The scaler multiplier and divisor coefficients are selected to provide a reference frequency to the PFD 206 that allows for the desired output frequency of the VCO 212 to be divided by a coefficient that includes a fractional portion that is not near to an integer value. For example, the scaler multiplier and divisor coefficients may be selected to provide a reference frequency to the PFD 206 that allows for the desired output frequency of the VCO 212 to be divided by a coefficient that includes a fractional portion of at least a predetermined minimum value (e.g., 0.2, 0.3, 0.4, or higher). By enabling use of a PLL loop divider coefficient that is not near an integer value for any output frequency of the fractional-N PLL 222, the fractional-N frequency synthesizer 102 increases the frequency of the spurious signals generated due to the fractional division such that the spurious frequencies are well outside the bandwidth of the fractional-N PLL 222. Because the spurious frequencies are outside of the bandwidth of the fractional-N PLL 222, the spurious frequencies are greatly reduced or eliminated from the output signal generated by the fractional-N PLL 222.

The integer frequency divider 202 may include counter logic (e.g., a binary counter) and/or other frequency division circuitry to divide the frequency input to the integer frequency divider 202 by any selected integer divisor coefficient. The integer frequency multiplier 204 may include various types of frequency multiplication circuitry that that allows the integer frequency multiplier 204 to multiply the frequency input to the integer frequency multiplier 204 by any selected integer divisor coefficient. In some embodiments, the integer frequency multiplier 204 includes a recirculating delay locked loop (DLL). The DLL can provide multiplication of an input frequency by a wide range of integer values without de-grading the phase noise within the loop bandwidth of the fractional-N PLL 222 and with negligible impact on the final output phase noise of the fractional-N PLL 222.

Figure 3:
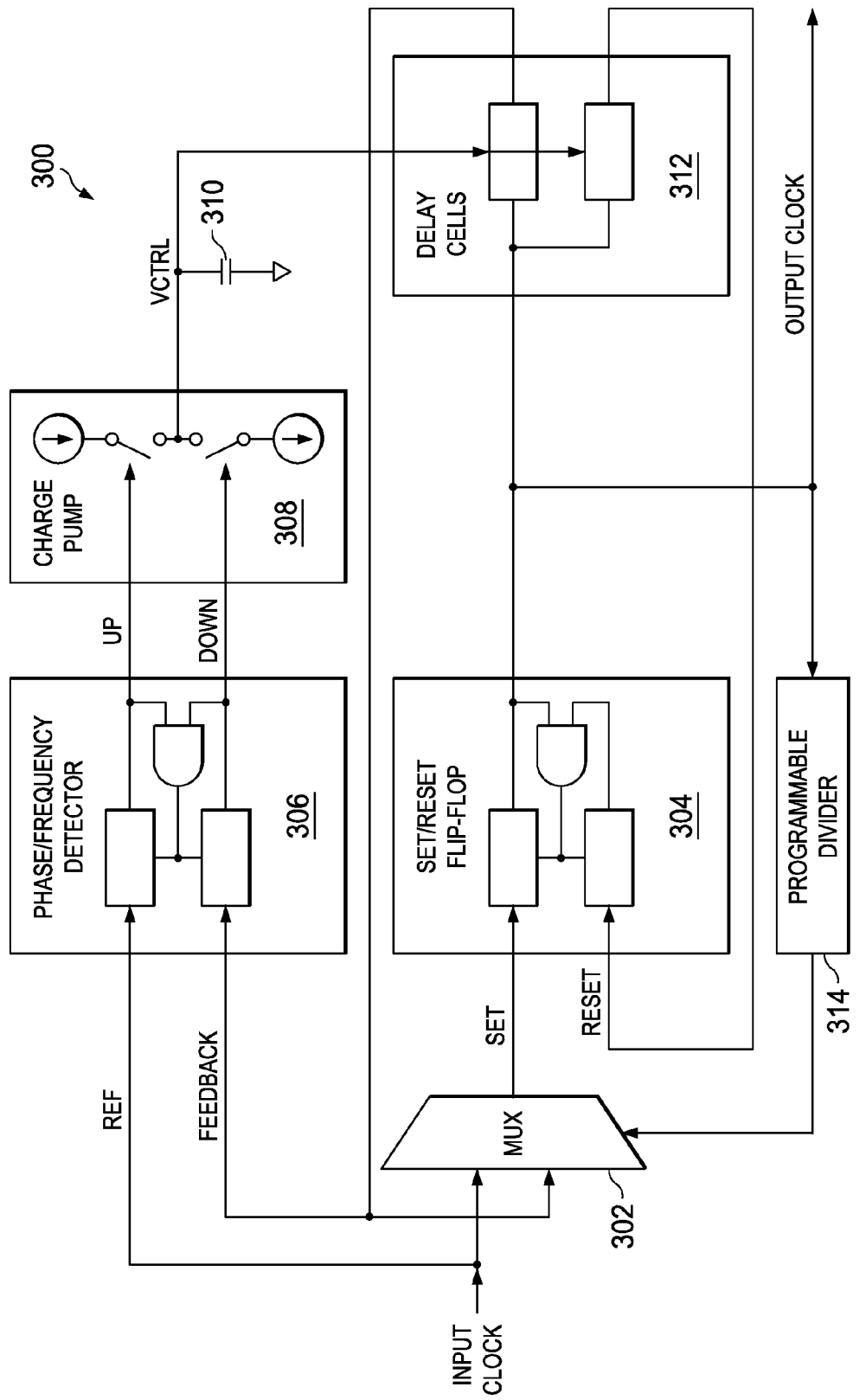
FIG. 3 shows a block diagram of a delay locked loop suitable for use in a fractional-N frequency synthesizer in accordance with various embodiments.

FIG. 3 shows a block diagram of a recirculating DLL 300 suitable for use in the integer frequency multiplier 204. The DLL 300 includes delay cells 312, a set/reset flip-flop 304, a multiplexer 302, a divider 314, a PFD 306, a charge pump 308, and capacitor 310. Other embodiments of a DLL suitable for use in the integer frequency multiplier 204 may include different/additional components arranged as needed to provide suitable frequency multiplication. Output of the set/reset flip-flop 304 is delayed in the delay cells 312 and forms the output of the DLL 300. The multiplexer 302 selects the input clock, output of the divider 314, or output of the delay cells 312 to set the set/reset flip-flop 304. Thus, recirculation is provided in the DLL 300. The set/reset flip-flop 304 is reset by output of the delay cells 312. The PFC 306 compares the output of the delay cells 312 to the input clock to identify differences in phase and/or frequency. The PFD 306 generates signals that cause the charge pump 308 to change the voltage across the capacitor 310. The voltage across the capacitor 310 sets the delay provided by the delay cells 312. The delay cells 312 include a current source and capacitor, where the current source discharges the capacitor to time the delay.

Figure 4:
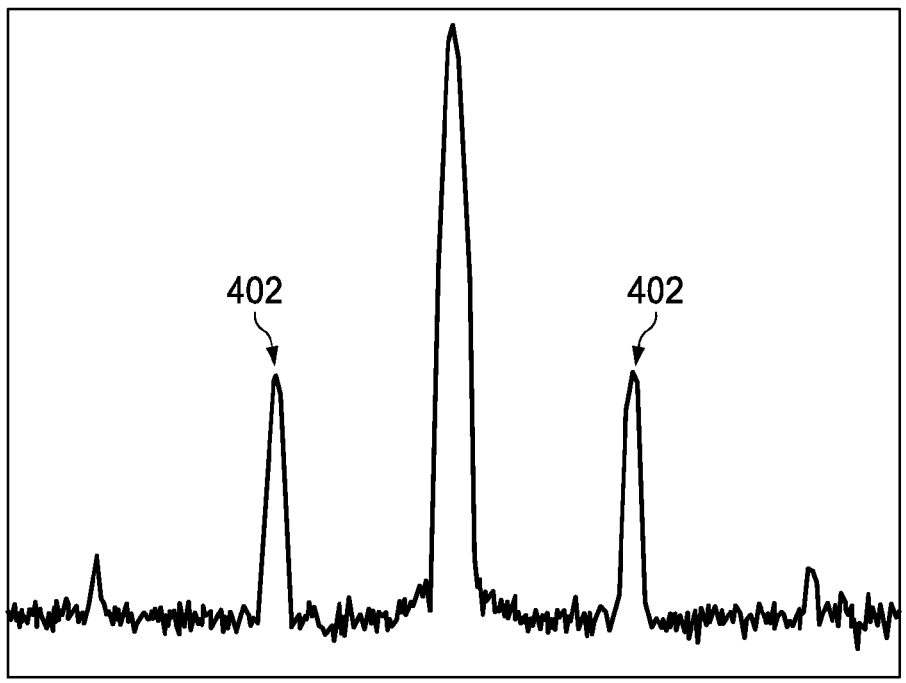
FIGS. 4 and 5 show an example of integer boundary spur suppression by a fractional-N frequency synthesizer in accordance with various embodiments.
Figure 5:
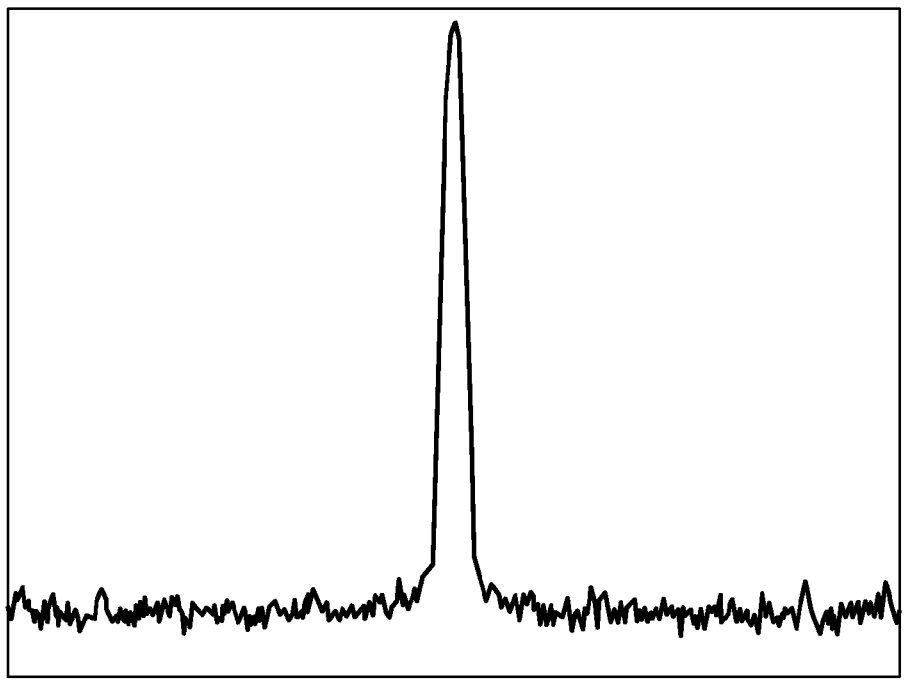

FIGS. 4 and 5 shows an example of integer boundary spur suppression by the fractional-N frequency synthesizer 102. FIG. 4 shows integer boundary spurs 402 in a conventional fractional-N frequency synthesizer using a 50 MHz reference frequency at the PFD, 5000.01 MHz VCO output frequency and PLL loop divisor (N.F) of 100.0002. The integer boundary spurs occur at 10 kHz, and are therefore well within the bandwidth of the PLL.

In FIG. 5, the PLL reference scaler 220 divides the 50 MHz input frequency by 6 and multiples the divider 202 output frequency by 7 to produce a reference frequency of 58.33 MHz at the PFD 206. The output of the VCO 212 is 5000.01 MHz, and the PLL loop divisor (N.F) is 85.71428. With the fractional loop divisor of 85.71428 and reference frequency of 58.33 MHz, the integer boundary spurs occur at 41 MHz. 41 MHz is outside the bandwidth of the PLL 222, so the spurs are rejected by the fractional-N frequency synthesizer 102.

Figure 6:
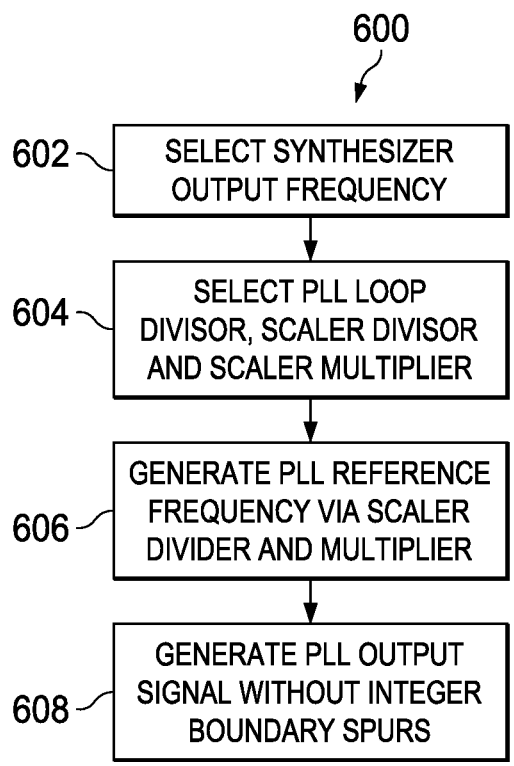
FIG. 6 shows a flow diagram for a method for fractional-N frequency synthesis in accordance with various embodiments.

FIG. 6 shows a flow diagram for a method for fractional-N frequency synthesis in accordance with various embodiments. Though depicted sequentially as a matter of convenience, at least some of the actions shown can be performed in a different order and/or performed in parallel. Additionally, some embodiments may perform only some of the actions shown.

In block 602, an output frequency for the fractional-N frequency synthesizer 102 is selected. For example, if the fractional-N synthesizer is included in the digital mobile radio 100, then the output frequency may be a multiple of 6.25 kHz or 12.5 kHz in the range of 30 MHz to 3 GHz.

In block 602, given the selected output frequency for the fractional-N frequency synthesizer 102, coefficients for the scaler multiplier 204, the scaler divisor 202, and the delta sigma modulator 216/integer loop divider 214 are selected. The coefficients are selected to provide the selected output frequency using a divisor in the fractional-N PLL 222 having a fractional portion that is at least a predetermined amount (e.g., 0.4). By ensuring that the fractional portion is at least the predetermined amount, the integer boundary spurs generated by the fractional-N PLL 222 are above the bandwidth of the fractional-N PLL 222. The coefficients for the scaler multiplier 204 and the scaler divisor 202 are selected to produce a reference frequency for use by the fractional-N PLL 222 that requires use of the divisor in the fractional-N PLL 222 having a fractional portion that is at least the predetermined amount.

In block 604, the selected scaler multiplier 204, scaler divisor 202, and delta sigma modulator 216/integer loop divider 214 coefficients are provided to the scaler multiplier 204, scaler divisor 202, and delta sigma modulator 216/integer loop divider 214 respectively. The PLL reference scaler 220 scales the input frequency provided to the PLL reference scaler 220 using the divisor and multiplier coefficients to generate and provide a reference frequency to the fractional-N PLL 222.

In block 606, the fractional-N PLL 222 generates an output signal at the selected frequency. Due to the scaling of the PLL reference frequency and selection of a corresponding PLL divisor coefficient, the signal output of the fractional-N PLL 222 does not include integer boundary spurs.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A fractional-N frequency synthesizer, comprising:
a fractional-N phase locked loop (PLL); and
a reference frequency scaler coupled to a reference clock input of the PLL, the reference frequency scaler comprising: a programmable frequency divider; and a programmable frequency multiplier connected in series with the programmable frequency divider;
wherein each of the divider and multiplier is configured to scale a reference frequency provided to the PLL by a programmable integer value; and
wherein for each output frequency generated by the PLL, the reference frequency scaler is configured to scale the reference frequency provided to the PLL by the reference frequency scaler such that a fractional portion of a frequency division coefficient applied in the PLL to generate the output frequency is at least a predetermined minimum value.

2. The frequency synthesizer of claim 1 further comprising a controller coupled to the reference frequency scaler, the controller configured to:
select a first integer value to be applied by the frequency multiplier to scale the reference frequency; and
select a second integer value to be applied by the frequency divider to scale the reference frequency.

3. The frequency synthesizer of claim 2, wherein the controller is configured to select the first integer value and the second integer value based on the reference frequency and an output frequency to be generated by the PLL.

4. The frequency synthesizer of claim 1, wherein for each output frequency generated by the PLL, the reference frequency scaler is configured to scale the reference frequency provided to the PLL by the reference frequency scaler such that integer boundary spurs in the output signal generated by the PLL are suppressed.

5. The frequency synthesizer of claim 1, wherein the programmable frequency multiplier comprises a recirculating delay locked loop (DLL).

6. A fractional-N frequency synthesizer, comprising:
a fractional-N phase locked loop (PLL); and
a reference frequency scaler coupled to a reference clock input of the PLL, the reference frequency scaler comprising: a programmable frequency divider; and a programmable frequency multiplier connected in series with the programmable frequency divider;
wherein each of the divider and multiplier is configured to scale a reference frequency provided to the PLL by a programmable integer value; and
wherein for each output frequency generated by the PLL, the reference frequency scaler is configured to scale the reference frequency provided to the PLL by the reference frequency scaler such that integer boundary spur frequencies in the PLL are higher than an upper limit of bandwidth of the PLL.

7. The frequency synthesizer of claim 6 further comprising a controller coupled to the reference frequency scaler, the controller configured to:
select a first integer value to be applied by the frequency multiplier to scale the reference frequency; and
select a second integer value to be applied by the frequency divider to scale the reference frequency.

8. The frequency synthesizer of claim 7, wherein the controller is configured to select the first integer value and the second integer value based on the reference frequency and an output frequency to be generated by the PLL.

9. The frequency synthesizer of claim 6, wherein for each output frequency generated by the PLL, the reference frequency scaler is configured to scale the reference frequency provided to the PLL by the reference frequency scaler such that integer boundary spurs in the output signal generated by the PLL are suppressed.

10. The frequency synthesizer of claim 6, wherein the programmable frequency multiplier comprises a recirculating delay locked loop (DLL).

11. A method for fractional-N frequency synthesis, comprising
selecting an output frequency to be generated;
scaling a frequency of a reference clock provided to a fractional-N phase locked loop (PLL) by dividing by a programmable integer divisor coefficient and multiplying by a programmable integer multiplier coefficient;
selecting the multiplier coefficient and the divisor coefficient for every output frequency of the PLL to suppress integer boundary spurs in the signal output of the PLL;
generating the output frequency in the PLL; and
selecting the integer multiplier coefficient and the integer divisor coefficient to generate the reference frequency provided to the PLL such that each of the output frequencies generated by the PLL are divisible to the reference frequency using a divisor having a fractional portion of at least a predetermined minimum value.

12. The method of claim 11, further comprising selecting the integer multiplier coefficient and the integer divisor coefficient based on the frequency of the reference clock and the output frequency to be generated by the PLL.

13. The method of claim 11, further comprising multiplying the frequency of the reference clock provided to the PLL in a recirculating delay locked loop.

14. A method for fractional-N frequency synthesis, comprising
selecting an output frequency to be generated;
scaling a frequency of a reference clock provided to a fractional-N phase locked loop (PLL) by dividing by a programmable integer divisor coefficient and multiplying by a programmable integer multiplier coefficient;
selecting the multiplier coefficient and the divisor coefficient for every output frequency of the PLL to suppress integer boundary spurs in the signal output of the PLL;
generating the output frequency in the PLL; and
selecting the integer multiplier coefficient and the integer divisor coefficient to generate the reference frequency provided to the PLL such that integer boundary spur frequencies in the PLL are higher than an upper bandwidth frequency of the PLL.

15. The method of claim 14, further comprising selecting the integer multiplier coefficient and the integer divisor coefficient based on the frequency of the reference clock and the output frequency to be generated by the PLL.

16. The method of claim 14, further comprising multiplying the frequency of the reference clock provided to the PLL in a recirculating delay locked loop.

17. A digital radio, comprising:
a radio frequency transceiver; and
a fractional-N frequency synthesizer coupled to the radio frequency transceiver, the frequency synthesizer configured to generate carrier frequencies for the radio frequency transceiver;
the fractional-N frequency synthesizer comprising: a fractional-N phase locked loop (PLL); and a reference frequency scaler coupled to a reference clock input of the PLL;
the reference frequency scaler comprising: a programmable frequency divider; and a programmable frequency multiplier connected in series with the programmable frequency divider;
wherein each of the divider and multiplier is configured to scale a reference frequency provided to the PLL by a programmable integer value; and
wherein for each output frequency generated by the PLL, the reference frequency scaler is configured to scale the reference frequency provided to the PLL such that a fractional portion of a frequency division applied in the PLL to generate the output frequency is at least a predetermined minimum value.

18. The digital radio of claim 17, wherein the programmable frequency multiplier comprises a recirculating delay locked loop (DLL).

19. The digital radio of claim 17, further comprising a controller coupled to the reference frequency scaler, the controller configured to:
select a first integer value to be applied by the frequency multiplier to scale the reference frequency; and
select a second integer value to be applied by the frequency divider to scale the reference frequency.

20. The digital radio of claim 19, wherein the controller is configured to select the first integer value and the second integer value based on the reference frequency and an output frequency to be generated by the PLL.

21. The digital radio of claim 17, wherein for each output frequency generated by the PLL, the reference frequency scaler is configured to scale the reference frequency provided to the PLL such that integer boundary spurs in the output signal generated by the PLL are suppressed.

22. A digital radio, comprising:
a radio frequency transceiver; and
a fractional-N frequency synthesizer coupled to the radio frequency transceiver, the frequency synthesizer configured to generate carrier frequencies for the radio frequency transceiver;
the fractional-N frequency synthesizer comprising: a fractional-N phase locked loop (PLL); and a reference frequency scaler coupled to a reference clock input of the PLL;
the reference frequency scaler comprising: a programmable frequency divider; and a programmable frequency multiplier connected in series with the programmable frequency divider;
wherein each of the divider and multiplier is configured to scale a reference frequency provided to the PLL by a programmable integer value; and
wherein for each output frequency generated by the PLL, the reference frequency scaler is configured to scale the reference frequency provided to the PLL such that integer boundary spur frequencies in the PLL are higher than an upper bandwidth frequency of the PLL.

23. The digital radio of claim 22, wherein the programmable frequency multiplier comprises a recirculating delay locked loop (DLL).

24. The digital radio of claim 22, further comprising a controller coupled to the reference frequency scaler, the controller configured to:
- select a first integer value to be applied by the frequency multiplier to scale the reference frequency; and
- select a second integer value to be applied by the frequency divider to scale the reference frequency.

25. The digital radio of claim 24, wherein the controller is configured to select the first integer value and the second integer value based on the reference frequency and an output frequency to be generated by the PLL.

26. The digital radio of claim 22, wherein for each output frequency generated by the PLL, the reference frequency scaler is configured to scale the reference frequency provided to the PLL such that integer boundary spurs in the output signal generated by the PLL are suppressed.

\* \* \* \* \*